(12) United States Patent
Särkkä

(10) Patent No.: US 11,811,372 B2
(45) Date of Patent: Nov. 7, 2023

(54) INSTRUMENTATION AMPLIFIER AND RELATED APPARATUS

(71) Applicant: Texas Instruments Incorporated, Dallas, TX (US)

(72) Inventor: Jussi Matti Aleksi Särkkä, Oulunsalo (FI)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 602 days.

(21) Appl. No.: 17/067,299

(22) Filed: Oct. 9, 2020

(65) Prior Publication Data

US 2021/0111681 A1  Apr. 15, 2021

Related U.S. Application Data

(60) Provisional application No. 62/914,338, filed on Oct. 11, 2019.

(51) Int. Cl.
| | |
|---|---|
| H03F 1/56 | (2006.01) |
| H03F 3/45 | (2006.01) |
| H02M 1/08 | (2006.01) |
| H03F 1/02 | (2006.01) |
| H02M 1/00 | (2006.01) |

(52) U.S. Cl.
CPC .......... *H03F 3/45179* (2013.01); *H02M 1/08* (2013.01); *H03F 1/0216* (2013.01); *H03F 1/56* (2013.01); *H02M 1/0038* (2021.05)

(58) Field of Classification Search
CPC ........ H03F 3/45179; H03F 1/56; H02M 1/08; H02M 3/1586
See application file for complete search history.

(56) References Cited

U.S. PATENT DOCUMENTS

2013/0093518 A1* 4/2013 Broyde ..................... H03F 3/45
 330/257
2014/0070886 A1* 3/2014 Bowers ............... H03F 3/45085
 330/260

* cited by examiner

Primary Examiner — Adolf D Berhane
Assistant Examiner — Afework S Demisse
(74) Attorney, Agent, or Firm — Charles F. Koch; Frank D. Cimino

(57) ABSTRACT

A feedback network has a feedback output terminal. A digital to analog converter has an analog output terminal. An amplifier includes an input differential pair having an inverting input terminal, a non-inverting input terminal, a first output current terminal and a second output current terminal. The inverting input terminal is coupled to the feedback output terminal, and the non-inverting input terminal is coupled to the analog output terminal. The amplifier includes a feedback differential pair having a third output current terminal, a fourth output current terminal, a first input terminal and a second input terminal. The third output current terminal is coupled to the first output current terminal, and the fourth output current terminal is coupled to the second output current terminal. The amplifier includes an amplifier output terminal coupled to the first input terminal and the second input terminal.

21 Claims, 2 Drawing Sheets

INSTRUMENTATION AMPLIFIER AND RELATED APPARATUS

CROSS-REFERENCE TO RELATED APPLICATION

This patent application claims the benefit of and priority to U.S. Provisional Patent Application Ser. No. 62/914,338 filed Oct. 11, 2019, which is hereby incorporated herein by reference in its entirety.

TECHNICAL FIELD

This relates generally to amplifiers, and more particularly to instrumentation amplifiers and related apparatus.

BACKGROUND

A buck converter (e.g., direct current to direct current (DC-DC) converter) converts an input voltage down to a lower desired voltage. A multiphase buck converter has multiple buck converters connected in parallel between an input and a load. Those multiple buck converters operate (e.g., turn on) at respective equally spaced intervals (e.g., phases) over a period of time. The multiphase buck converter responds quickly to changes in load, but those changes may cause undesirable voltage spikes (e.g., voltage overshoot and/or voltage undershoot). By reducing those voltage spikes, a tolerance band of the buck converter's output voltage is reduced, it has a lower risk of triggering overvoltage protection, and it prolongs life of electronic devices that are driven by the multiphase buck converter.

SUMMARY

A feedback network has a feedback output terminal. A digital to analog converter has an analog output terminal. An amplifier includes an input differential pair having an inverting input terminal, a non-inverting input terminal, a first output current terminal and a second output current terminal. The inverting input terminal is coupled to the feedback output terminal, and the non-inverting input terminal is coupled to the analog output terminal. The amplifier includes a feedback differential pair having a third output current terminal, a fourth output current terminal, a first input terminal and a second input terminal. The third output current terminal is coupled to the first output current terminal, and the fourth output current terminal is coupled to the second output current terminal. The amplifier includes an amplifier output terminal coupled to the first input terminal and the second input terminal.

DETAILED DESCRIPTION

Figure 1:
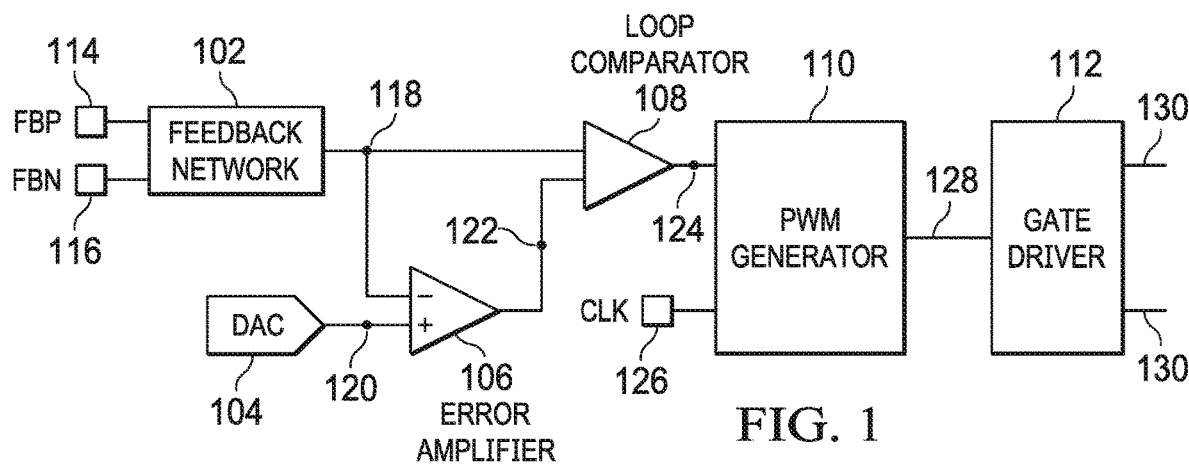
FIG. 1 is a block diagram of a portion of an example buck converter.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Various forms of the term "couple" are used in this description. These terms may cover connections, communications or signal paths that enable a functional relationship consistent with this description. For example, if device A generates a signal to control device B to perform an action, then: (a) in a first example device, A is coupled to device B by direct connection; or (b) in a second example device, A is coupled to device B through intervening component C if intervening component C does not alter the functional relationship between device A and device B, such that device B is controlled by device A via the control signal generated by device A.

In this description, the term "configured to" may encompass being configurable, but it does not require being configurable. Certain features described herein in the context of separate embodiments can also be implemented in combination in a single embodiment. Conversely, various features described herein in the context of a single embodiment can also be implemented in multiple embodiments separately or in any suitable subcombination.

Even if the drawings show operations performed in an example particular order, such operations are not required be performed in the example particular order or in sequential order, and some illustrated operations may be optional. In certain circumstances, multitasking and parallel processing may be advantageous.

A multiphase buck converter includes a voltage control loop (e.g., a feedback loop) that regulates an output voltage. The voltage control loop of the buck converter includes an amplifier, such as an error amplifier or an instrumentation amplifier, which regulates the output voltage based on a reference signal (e.g., an input signal corresponding to a desired output voltage) and a feedback signal (e.g., an input signal corresponding to the current output voltage). To efficiently regulate the output voltage, the amplifier of the multiphase buck converter should meet a number of specifications. For example, the amplifier should include a high bandwidth, low output impedance, high input impedance, be able to enter a full-performance state from a low power state quickly, and include a constant and known gain. Additional specifications may be required based on the application of the multiphase buck converter.

The amplifier of the multiphase buck converter should operate with generally high bandwidth (e.g., 10 times or more relative to the bandwidth of the buck converter) to maintain a sufficient phase margin (e.g., negative phase perturbation that makes a system in which the multiphase buck converter operates, marginally stable) to prevent loop degradation (e.g., a negative effect of efficiency of the voltage control loop).

The amplifier of the multiphase buck converter should include low output impedance (e.g., little to no resistance at the output of the amplifier) due to capacitive loading (e.g., a load that draws a leading current due to the load having a capacitive reactance greater than an inductive reactance) in the voltage control loop. Without a low output impedance, the regulated output voltage can be affected by current drawn from an external load (e.g., capacitive loading). For example, without a low output impedance, the voltage control loop will have a pole that forms at a low frequency, which will degrade the phase margin of the buck converter.

The amplifier of the multiphase buck converter should include high input impedance (e.g., resistance at the inputs of the amplifier of the buck converter) because the reference signal and feedback signal have generally medium to high impedance. The amplifier of the multiphase buck converter cannot load the reference signal and/or feedback signal to counter the high impedance of the signal(s) or else the output voltage will be incorrectly regulated.

The amplifier of the multiphase buck converter should have the ability to enter a full-performance state from a low power state quickly, because multiphase buck converters usually operate in a pulse-frequency modulation (PFM) mode, which is a switching method useful in many DC-DC voltage converters to improve efficiency at light loads. In some examples, PFM mode is also referred to as power save mode. In a PFM mode, the buck converter includes tight quiescent current (IQ) specifications. Quiescent current (IQ) is the current drawn by an integrated circuit (IC) of a device in a no-load (e.g., no current leaves the IC to the output, such that all quiescent current travels inside the IC) and non-switching (e.g., no power switch in the IC is on and/or otherwise closed) but enabled condition. As used herein, a tight IQ specification indicates that the buck converter is able to cause the components that consume current to enter a low power state by shutting-down (e.g., turning off, removing power, etc.) those components. Also, the same components have the ability to start-up from that low power state very quickly. Therefore, to meet the requirements of the IQ specifications, the amplifier of the multiphase buck converter should consume generally low amounts of current to be able to start-up quickly from a low power state.

The amplifier of the multiphase buck converter should include a constant and known gain because the amplifier is within the control loop. For example, if the gain of the amplifier in the control loop is not constant or known, then the bandwidth of the multiphase buck converter may change, which will affect the stability of the control loop, the phase margin, the load transient response, and anything else critical to the performance of the buck converter.

In some examples, the above-described specifications and requirements for the amplifier of the buck converter cause the design and structure of the amplifier to be expensive and complex. Therefore, an instrumentation-like amplifier herein is streamlined in design and meets the requirements and specifications described above. For example, an example amplifier herein, implemented within a control loop, includes high input impedance and low output impedance, enters a full-performance state rapidly, and has an easily determined and constant gain. The example amplifier is similar to an instrumentation amplifier because the amplifier includes a high input impedance, a low output impedance, and a constant gain. However, in an instrumentation amplifier, the gain of the amplifier is set using resistors. In examples herein, transconductances of a differential pair (such as a pair of transistors, a pair of switches, a pair of metal oxide semiconductor field-effect transistors (MOSFETs), etc.) determine and/or otherwise set the gain of the amplifier. In examples herein, the gain of the amplifier is held constant and does not change over temperature, voltage and process. Therefore, the bandwidth of the buck converter is not negatively affected (e.g., does not vary over temperature, voltage, and process).

In examples described herein, the amplifier is streamlined in terms of the structure. For example, the structure of the amplifier is streamlined in comparison to an instrumentation amplifier, so the amplifier includes fewer components than an instrumentation amplifier (such as fewer transistors, fewer resistors, etc.). The structure of the amplifier reduces the required area size due to smaller sizes of the components, the fewer amounts of components, and the connecting of the inputs and outputs of the components. The required area size of the amplifier is reduced by a factor that depends on the specifications of the amplifier. In some examples, the area size of the amplifier is reduced by a factor of five to ten (e.g., a fifth or a tenth of the area size of a different amplifier). Also, the amplifier starts-up relatively quickly from the low power state.

FIG. 1 is a block diagram of an example buck converter 100. In FIG. 1, the buck converter 100 includes an example feedback network 102, an example digital to analog converter (DAC) 104, an example amplifier 106, an example loop comparator 108, an example PWM generator 110, and an example gate driver 112. The buck converter 100 is, generally, a DC-DC power converter that steps down voltage (while stepping up current) from an input (not shown) of the buck converter 100 at an output (not shown) of the buck converter 100. The buck converter 100 may include additional parts not illustrated herein. In FIG. 1, the buck converter 100 may be a multiphase buck converter, a synchronous buck converter, or any other type of DC-DC step down converter.

In FIG. 1, the buck converter 100 includes the feedback network 102 to facilitate the regulating of the output voltage of the buck converter 100. The example feedback network 102 includes an example positive feedback input 114 and an example negative feedback input 116. The positive feedback input 114 and the negative feedback input 116 correspond to the output (not shown) of the buck converter 100. For example, the positive feedback input 114 and the negative feedback input 116 may include signals received from the output of the buck converter 100, such as the output of an inductor of the buck converter 100. The feedback network 102 provides a signal on a feedback output at feedback node 118. In some examples, the feedback network 102 is configured to maintain the gain in feedback signal (e.g., the signal on the positive feedback input 114 and the signal on the negative feedback signal 116) regardless of the frequency in the buck converter 100. In this manner, the feedback network 102 provides the feedback signal at feedback node 118 as an accurate representation of the output of the buck converter 100. The feedback network 102 is: coupled to the loop comparator 108 at the feedback node 118; and coupled to an inverting input of the amplifier 106 at feedback node 118. In some examples, the feedback network 102 provides the amplifier 106 and the loop comparator 108 with the feedback signal at feedback node 118.

In FIG. 1, the buck converter 100 includes the digital to analog converter (DAC) 104 to provide a reference signal at reference node 120 to the amplifier 106. The DAC 104 converts a digital control signal (such as controlled by software, hardware, a combination of hardware and software etc.) into the reference signal (e.g., voltage) to which the buck converter 100 is trying to regulate the output voltage. The DAC 104 provides the reference signal at reference node 120, and the amplifier 106 is configured to compare the reference signal to the feedback signal output at feedback node 118. The DAC 104 is coupled to a non-inverting input of the amplifier 106 at the reference node 120.

In FIG. 1, the buck converter 100 includes the amplifier 106 to generate an error control signal based on a comparison between the feedback signal at the feedback node 118 and the reference signal at the reference node 120. The amplifier 106 provides the error control signal at an output error control node 122, which is coupled to the loop comparator 108. Therefore, the amplifier 106 is coupled to the loop comparator 108 at output error control node 122. The amplifier 106 generates the error control signal representing the difference between the output voltage of the buck converter 100 (e.g., the output voltage supplied to a load, represented by the output signal of the feedback network 102) and the reference voltage, such as a setpoint voltage, and the error control signal is provided to the loop comparator 108 for comparison with the feedback signal (e.g., the output voltage of the buck converter 100). The amplifier 106 is a modified error amplifier. Additionally and/or alternatively, the amplifier 106 is a modified instrumentation amplifier. The amplifier 106 includes high input impedance and low output impedance, enters a full-performance state rapidly, and has an easily determined and constant gain. The amplifier 106 is described in further detail below in connection with FIG. 2.

In FIG. 1, the buck converter 100 includes the loop comparator 108 to compare the error control signal to the feedback signal. The loop comparator 108 compares the feedback signal to the error control signal and generates a digital signal to turn on a high side or a low side power switch (e.g., power FET) of the buck converter 100 to start conducting. In this manner, if the output voltage sags, then the loop comparator 108 receives the error signal from the amplifier 106 that causes the loop comparator 108 to output a digital signal, which turns on the high side power switch of the buck converter 100 to increase inductor current. Also, if the output voltage is too high, then the loop comparator 108 generates a digital signal that turns on the low side power switch to decrease inductor current. The loop comparator 108 includes a first comparator input terminal, a second comparator input terminal, and a loop comparator output terminal. The first comparator input terminal of the loop comparator 108 is coupled to the feedback network 102 at the feedback node 118. The second comparator input terminal of the loop comparator 108 is coupled to the amplifier 106 (e.g., the output of the amplifier 106) at output error control node 122. The loop comparator output terminal of the loop comparator 108 is coupled to the PWM generator 110 at a digital node 124. The loop comparator 108 provides the digital signal to the PWM generator 110 at the digital node 124.

In FIG. 1, the buck converter 100 includes the PWM generator 110 to generate control signal(s) based on a clock 126 and the digital signal at the digital node 124. The PWM generator 110 is a PWM circuit that, when responsive to the digital signal, can generate example PWM signal(s) 128 at one or more output terminals of the PWM generator 110 to control one or more switches in the buck converter 100. For example, the PWM generator 110 generates PWM signal(s) 128 that control(s) one or more switches based on the digital signal. The PWM generator 110 includes an input terminal that is coupled to the loop comparator output terminal of the loop comparator 108 at digital node 124. The PWM generator 110 further includes a clock input terminal coupled to the clock 126. The PWM generator 110 further includes one or more output terminals, which are coupled to the gate driver 112 and include the PWM signal(s) 128.

In FIG. 1, the buck converter 100 includes the gate driver 112 to drive the gates of the one or more switches in the buck converter 100 based on the PWM signal(s) 128. For example, the gate driver 112 may include amplification logic, comparison logic, etc., to facilitate generating one or more appropriate gate signals 130 (e.g., signals corresponding to the PWM signal(s) 128) for controlling the gates of the one or more switches. The gate driver 112 may output gate signal(s) 130 directly to the gate(s) (e.g., the gate terminal(s)) of the one or more switches.

Figure 2:
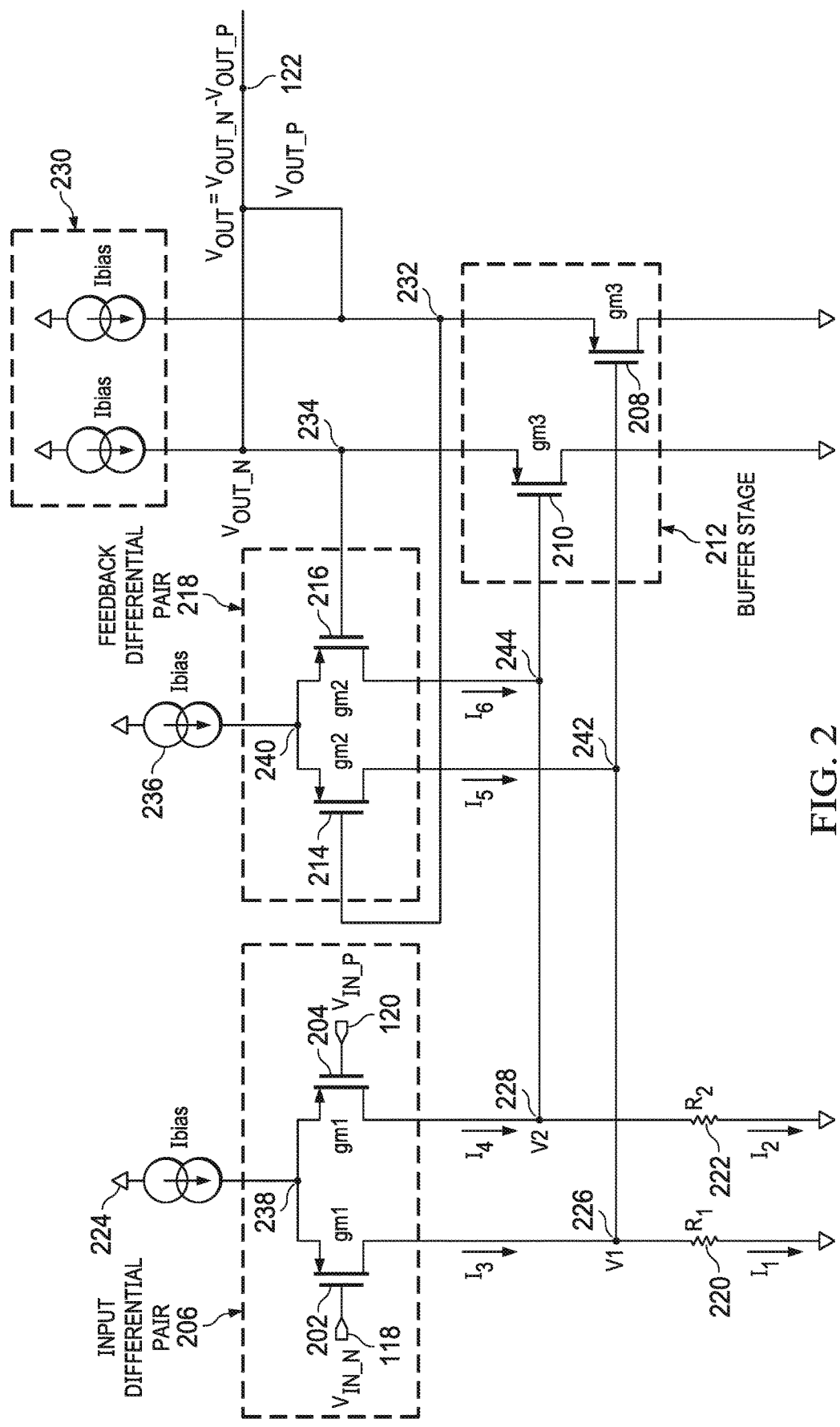
FIG. 2 is a schematic diagram of an example amplifier of FIG. 1 to generate an error control signal.

FIG. 2 is a schematic diagram of the amplifier 106 of FIG. 1 to generate an error control signal. The amplifier 106 includes: an example first switch 202 and an example second switch 204 that together form an example input differential pair 206; an example third switch 208 and an example fourth switch 210 that together form an example buffer stage 212; an example fifth switch 214 and an example sixth switch 216 that together form an example feedback differential pair 218; an example first resistor (R1) 220; and an example second resistor (R2) 222. The first switch 202, the second switch 204, the third switch 208, the fourth switch 210, the fifth switch 214, and the sixth switch 216 are implemented by p-channel field-effect transistors (PFETs) (such as p-channel silicon FETs, p-channel gallium nitride (GaN) FETs, etc.). Alternatively, the first switch 202, the second switch 204, the third switch 208, the fourth switch 210, the fifth switch 214, and/or the sixth switch 216 may be implemented by a different type of transistor, such as a bipolar junction transistor (BJT), an n-channel field-effect transistor (NFET), a junction gate field-effect transistor (JFET), etc.

The amplifier 106 includes the input differential pair 206 to generate first and second voltages (V1 and V2) based on the feedback signal (denoted as $Vin_n$) and the reference signal (denoted as $Vin_p$). The first switch 202 and the second switch 204 have a same physical size, receive a same biasing current, and therefore can have a same transconductance (gm1). Accordingly, the input differential pair 206 can be generally referred to as having first transconductance gm1. In some examples, the first switch 202 is formed by a number of transistors coupled in parallel, and the second switch 204 is formed by a same number of transistors coupled in parallel.

A gate terminal of the first switch 202 is coupled to the feedback network 102 of FIG. 1 at the feedback node 118. A gate terminal of the second switch 204 is coupled to the DAC 104 of FIG. 1 at reference node 120. Respective source terminals (e.g., current terminals) of the first switch 202 and the second switch 204 are coupled to a first current biasing source 224 at a first bias node 238. A drain terminal (e.g., a current terminal) of the first switch 202 is coupled to a first terminal of the first resistor 220 at a first node 226. A drain terminal (e.g., current terminal) of the second switch 204 is coupled to a first terminal of the second resistor 222 at a second node 228. The first resistor 220 includes a second terminal coupled to ground. The second resistor 222 also includes a second terminal coupled to ground.

The amplifier 106 includes the buffer stage 212 to buffer voltages (V1 and V2) from the input differential pair 206 to the output of the amplifier 106 (e.g., to the error output control node 122). For example, the third switch 208 and the fourth switch 210 of the buffer stage 212 generate the output voltages (Vout_n and Vout_p) based on voltages V1 and V2. The buffer stage 212, among other factors, determines the output impedance of the amplifier 106. The third switch 208 and the fourth switch 210 are matched and biased to a same current density, so they shift the voltages V1 and V2 by the same amounts and do not cause any offset.

In the buffer stage 212, a gate terminal of the third switch 208 is coupled to the drain terminal of the first switch 202 and the first terminal of the first resistor 220 at the first node 226. A gate terminal of the fourth switch 210 is coupled to the drain terminal of the second switch 204 and the first terminal of the second resistor 222 at the second node 228. A source terminal (e.g., current terminal) of the third switch 208 is coupled to a first output terminal of a second current biasing source 230 at a third node 232 (e.g., a first output node). A source terminal (e.g., current terminal) of the fourth switch 210 is coupled to a second output terminal of the second current biasing source 230 at a fourth node 234 (e.g., a second output node). Also, the respective source terminals (e.g., current terminals) of the third switch 208 and fourth switch 210 are coupled to the loop comparator 108 of FIG. 1 at the output error control node 122.

The amplifier 106 includes the feedback differential pair 218 to provide negative feedback within the amplifier 106 to achieve a low output impedance. The fifth switch 214 and the sixth switch 216 have a same physical size, receive a same biasing current, and therefore have a same transconductance (gm2). The fifth switch 214 and the sixth switch 216 are formed by transistors having a same channel size as the first switch 202 and the second switch 204 of the input differential pair 206 and, thus, have a same current density as the first switch 202 and second switch 204 when biased with a suitable current. Accordingly, the feedback differential pair 218 can be generally referred to as having second transconductance gm2. The feedback differential pair 218 is used to determine the gain of the amplifier 106 together with the input differential pair 206. In some examples, the fifth switch 214 is formed by a number of transistors coupled in parallel, and the sixth switch 216 is formed by a same number of transistors as the fifth switch 214 coupled in parallel. The number of transistors that together form the fifth switch 214 and the sixth switch 216 may be different than the number of transistors that together form the first switch 202 and the second switch 204 of the input differential pair 206.

A gate terminal of the fifth switch 214 is coupled to the source terminal (e.g., current terminal) of the third switch 208 at the third node 232. A gate terminal of the sixth switch 216 is coupled to the source terminal (e.g., current terminal) of the fourth switch 210 at the fourth node 234. Respective source terminals (e.g., current terminals) of the fifth switch 214 and the sixth switch 216 are coupled to an output terminal of a third current biasing source 236 at a second bias node 240. A drain terminal (e.g., current terminal) of the fifth switch 214 is coupled to the first terminal of the first resistor 220 at a fifth node 242. A drain terminal (e.g., current terminal) of the sixth switch 216 is coupled to the first terminal of the second resistor 222 at the sixth node 244. In examples described herein, the first node 226 and the fifth node 242 are coupled, so the first node 226 and the fifth node 242 have a same electric potential (e.g., the voltage indicated by V1). In other examples described herein, the second node 228 and the sixth node 244 are coupled, so the second node 228 and the sixth node 244 have a same electric potential (e.g., the voltage indicated by V2).

In some examples, the amplifier 106 may tolerate a variance in gain to some degree. In such an example, the input differential pair 206 may include transistors having one size (e.g., physical size, channel size, etc.), and the feedback differential pair 218 may include transistors having a slightly different size (e.g., physical size, channel size, etc.). In this example, the current densities of the input differential pair 206 may be slightly different than the current densities of the feedback differential pair 218. In this manner, the gain of the amplifier 106 will have a greater variance, but would still operate in a similar manner.

In an example operation of the amplifier 106, the non-inverting input (e.g., the gate terminal of the second switch 204) receives a reference signal ($Vin_p$) from the DAC 104 at reference node 120, and the inverting input (e.g., the gate terminal of the first switch 202) receives a feedback signal ($Vin_n$) from the feedback network 102 at feedback node 118. Responsive to the signals ($Vin_p$ and $Vin_n$), the input differential pair 206 generates input currents $I_3$ and $I_4$. For example, the first switch 202 generates a first input current ($I_3$) based on the first transconductance (gm1) and a negative version of the feedback signal ($Vin_n$) (e.g., $I_3 = -Vin_n * gm1$). The second switch 204 generates a second input current ($I_4$) based on the first transconductance (gm1) and a negative version of the reference signal ($Vin_p$) (e.g., $I_4 = -Vin_p * gm1$). The input currents $I_3$ and $I_4$ are generated with a negative version of both of the input signals (e.g., $Vin_n$ and $Vin_p$), because the first switch 202 and the second switch 204 are PFETs. Accordingly, responsive to the voltage (e.g., the reference signal and/or the feedback signal) at the respective gate terminals increasing, the current generated (e.g., flowing) at the respective drain terminals decreases. The voltages and currents described herein are deviations from a direct current (DC) operating point where $Vin_p$ equals $Vin_n$ (e.g., the input voltage is zero).

The first transconductance (gm1) of the input differential pair 206 is the same across both the first switch 202 and the second switch 204 when the input voltage is zero (e.g., when $Vin_n$ and $Vin_p$ are equal), because of the sizes (e.g., the ratio of width (W) and length (L) of the channel in the first switch 202 and second switch 204) and fabrication of the switches 202 and 204, and because of the first biasing current source 224. For example, the first biasing current source 224 is configured to output a bias current (to the respective source terminals of the first switch 202 and the second switch 204) that causes the first switch 202 and the second switch 204 to have matching current densities when the input voltage is zero. In examples when $Vin_n$ and $Vin_p$ are not equal, the average of the transconductances (gm1) of the input differential pair 206 remains fairly constant. For example, if the input voltage of the first switch 202 is higher than the input voltage of the second switch 204, then the gate-to-source voltage (Vgs) of the first switch 202 is less than the Vgs of the second switch 204 and, thus, the current at the drain terminal of the first switch 202 is less than the current at the drain terminal of the second switch 204. However, the average transconductance (gm1) of the two switches 202, 204 remains constant. As used herein, the current density can be defined as the electric current carried by the conductor (e.g., the conducting n-channel or p-channel in the field-effect transistor (FET)) per unit cross-sectional area of the conducting medium.

The input currents $I_3$ and $I_4$ flow into the resistors R1 and R2. For example, the first input current $I_3$ flows into the first resistor (R1) 220, and the second input current $I_4$ flows into the second resistor (R2) 222. The first and second resistors 220 and 222 have approximately a same size and resistance. For example, the resistance of the first resistor (R1) 220 is approximately equal to the resistance of the second resistor (R2) 222. In some examples, the first and second resistors 220 and 222 are fabricated identically and matched to prevent against offset in the amplifier 106. In this manner, the voltages V1 and V2 are readily determinable. The resistors 220 and 222 have resistances that achieve a desired open loop amplification of the input signals (e.g., reference signal and feedback signal). The sizes of the resistors 220 and 222 are chosen to achieve a desired open loop gain of the amplifier 106, in order to reduce output impedance when using the negative feedback.

In some examples, an active load can alternatively be used in place of or in parallel with the resistors 220 and 222. For example, current mirrors may be implemented within the amplifier 106 instead of resistors to reduce output impedance of the amplifier 106 when using negative feedback.

The voltages V1 and V2 are determined based on the input currents $I_3$ and $I_4$, the first resistor (R1) 220 and the second resistor (R2) 222, and feedback currents $I_5$ and $I_6$. During the example operation, feedback currents $I_5$ and $I_6$ are generated (e.g., flowing) responsive to output signals (Vout_p and Vout_n) of the amplifier 106 that are input to the feedback differential pair 218. For example, the feedback differential pair 218 receives a first output voltage (Vout_p) (e.g., at the gate terminal of the fifth switch 214) and a second output voltage (Vout_n) (e.g., at the gate terminal of the sixth switch 216). Responsive to the output signals (Vout_p and Vout_n), the feedback differential pair 218 generates feedback currents $I_5$ and $I_6$. The fifth switch 214 generates a first feedback current ($I_5$) based on the second transconductance (gm2) and a negative version of the first output voltage (Vout_p) (e.g., $I_5$=−Vout_p*gm2). The sixth switch 216 generates a second feedback current ($I_6$) based on the second transconductance (gm2) and a negative version of the second output voltage (Vout_n) (e.g., $I_6$=−Vout_n*gm2). The feedback currents $I_5$ and $I_6$ are generated with a negative version of both of the output signals (e.g., Vout_n and Vout_p) because the fifth switch 214 and the sixth switch 216 are PFETs. Accordingly, responsive to the voltage (e.g., the first output voltage and/or the second output voltage) at the respective gate terminals increasing, the current generated (e.g., flowing) at the respective drain terminals decreases. The second transconductance (gm2) of the feedback differential pair 218 is the same across both the fifth switch 214 and the sixth switch 216 when the input voltage is zero (e.g., when the signals at nodes 234 and 232 are equal), because of the sizes (e.g., the ratio of W and L of the channels in the fifth switch 214 and sixth switch 216) and fabrication of the switches 214 and 216, and because of the third biasing current source 236. For example, the third biasing current source 236 is configured to output a bias current (to the respective source terminals of the fifth switch 214 and the sixth switch 216) that causes the fifth switch 214 and the sixth switch 216 to have matching current densities when the input voltage is zero. In examples when the signals at nodes 232 and 234 are not equal, the average of the transconductances (gm2) of the feedback differential pair 218 remains fairly constant.

The feedback currents $I_5$ and $I_6$ are negative feedback currents to achieve lower output impedance of the amplifier 106. The feedback currents $I_5$ and $I_6$ are used to determine the gain of the amplifier 106. Low output impedance is essential in the amplifier 106 due to capacitive loading at the output (e.g., the capacitive loading of the loop comparator 108 that is driving the PWM generator 110). If the impedance at the output of the amplifier 106 (e.g., at the output error control node 122) is not low enough, then a pole will be formed with a frequency that is inside or at least near the bandwidth of the buck converter 100. Accordingly, if a pole forms with a frequency that is too near the bandwidth of the buck converter 100, then the phase margin will decrease and, thus, the buck converter 100 could become unstable. Phase margin is a measure of how much phase lag could be introduced to the loop at the unity gain frequency before the buck converter 100 becomes unstable. Therefore, the feedback differential pair 218 is configured to achieve low output impedance of the amplifier 106, so no poles can be formed to a frequency that is too low (e.g., too near the frequency of the bandwidth of the buck converter 100). Without the negative feedback inside the amplifier 106, the amplifier 106 would have to be biased with a higher current and use a larger area to achieve the desired level of impedance.

Referring again to the example operation of the amplifier 106, the feedback currents $I_5$ and $I_6$ flow into the resistors R1 and R2. For example, the first feedback current $I_5$ flows into the first resistor (R1) 220, and the second feedback current $I_6$ flows into the second resistor (R2) 222.

Responsive to the input currents ($I_3$ and $I_4$) and the feedback currents ($I_5$ and $I_6$), the resistors 220 and 222 generate the voltages V1 and V2. The voltages V1 and V2 are amplified signals of the input signals (e.g., reference signal and feedback signal). The voltages V1 and V2 are generated at the first node 226 and the second node 228 respectively. For example, the first voltage V1 is based on the resistance of R1 220 and a combination of the first input current ($I_3$) and the first feedback current ($I_5$) (e.g., V1=R*($I_3$+$I_5$)), where the combination of the first input current ($I_3$) and the first feedback current ($I_5$) together form the first current ($I_1$). In another example, the second voltage V2 is based on the resistance of R2 222 and a combination of the second input current ($I_4$) and the second feedback current ($I_6$) (e.g., V2=R*($I_4$+$I_6$)), where the combination of the second input current ($I_4$) and the second feedback current ($I_6$) together form the second current ($I_2$). For example, the first voltage V1 corresponds to the first current ($I_1$) times the resistance of the first resistor (R1) 220. The second voltage V2 corresponds to the second current ($I_2$) times the resistance of the second resistor (R2) 222.

The respective gate terminals of the third switch 208 and the fourth switch 210 receive the respective first and second voltages (V1 and V2) at the respective first node 226 and second node 228. For example, the gate terminal of the third switch 208 receives the first voltage V1 at the first node 226. The gate terminal of the fourth switch 210 receives the second voltage V2 at the second node 228. Responsive to the first and second voltages (V1 and V2), the buffer stage 212 buffers the first and second voltages (V1 and V2) at the output. For example, the amplifier's output impedance is small enough because a large enough ratio exists between: the change in current at the respective drain terminals of the third switch 208 and fourth switch 210; and the change in voltage at the respective gate terminals of the third switch 208 and fourth switch 210 (e.g., the transconductance gm3 of the buffer stage 212). In some examples, the third switch 208 and the fourth switch 210 level shift the respective gate voltages (V1 and V2) to the respective source terminals. The Vgs (e.g., the amount by which the buffered voltages V1 and V2 is shifted up) depends on the bias current of the third switch 208 and the fourth switch 210 and their respective W/L ratios. Therefore, the third switch 208 and the fourth switch 210 shift up the first voltage V1 and the second voltage V2 by a same amount, because the third switch 208 and the fourth switch 210 are fabricated using identical matched transistors. In this manner, V1−V2 equals the first output voltage (Vout_p) minus the second output voltage (Vout_n).

The first output voltage (e.g., Vout_p) and the second output voltage (e.g., Vout_n) are compared to generate the error control signal at the output error control node 122. For example, the amplifier 106 subtracts the second output voltage (e.g., corresponding to the feedback signal) from the first output voltage (e.g., corresponding to the reference signal) and provides the low impedance result (e.g., the error control signal) at the output error control node 122. In some examples, the difference between the first output voltage and the second output voltage (e.g., the error control signal) causes the loop comparator 108 to trigger later or trigger earlier relative to the clock signal, thereby causing the PWM generator 110 to adjust the duty cycle of the power switches (e.g., power MOSFETs) and, thus, regulating the output voltage of the buck converter 100. For example, if the feedback signal at the feedback node 118 is higher than the reference signal at the reference node 120 (e.g., the desired output signal), then the amplifier 106 generates the error control signal (e.g., the difference between the first output voltage Vout_p and the second output voltage Vout_n) to indicate the output increase, and, thus, the PWM generator 110 decreases the duty cycle.

The example error control signal (Vout) provided by the amplifier 106 has a value based on a constant gain set by the amplifier 106. For example, the amplifier 106 increases the input signal (e.g., the input signal (Vin) is equal to the difference between the reference signal and the feedback signal) by a factor of gain A at the output (e.g., the output error control node 122) of the amplifier 106. The amplifier 106 determines the gain A based on the ratio of output voltage (e.g., the difference between the first output voltage (Vout_p) and the second output voltage (Vout_n)) to the input voltage (e.g., the difference between the reference signal at node 120 and the feedback signal at node 118). For example, the equation for the gain of the amplifier 106 is determined using Equation 1 below. In Equation 1, $Vin_p$ is the feedback signal at the feedback node 118, and $Vin_n$ is the reference signal at the reference node 120.

$$\text{Gain}=(Vout\_p-Vout\_n)/(Vin_p-Vin_n) \quad \text{Equation 1}$$

In Equation 1 above, the first output voltage (Vout_p) and the second output voltage (Vout_n) are determined based on a combination of the input voltages, the first transconductance (gm1) of the input differential pair 206, the second transconductance (gm2) of the feedback differential pair 218, and the resistance (R) of the resistors 220 and 222. In this manner, the gain of the amplifier 106 can be further simplified from Equation 1 above. For example, the gain of the amplifier 106 is determined using Equation 2 below.

$$\text{Gain}=Vout/Vin=(R\times gm1)/(1+R\times gm2) \quad \text{Equation 2}$$

In Equation 2 above, the ratio of the output voltage (Vout) to the input voltage (Vin) is simplified to the resistance value R and the transconductances (gm1, gm2), because the input differential pair 206 and the feedback differential pair 218 maintain a constant ratio of transconductance (gm1:gm2). For example, the first switch 202 and the second switch 204 are fabricated from identical and/or approximately identical switch pieces (e.g., their channels have a same width and a same length) and, thus, include a same transconductance (gm1) when biased to a same current and when receiving a same input voltage. Similarly, in another example, the fifth switch 214 and the sixth switch 216 are also fabricated from identical and/or approximately identical switch pieces (e.g., their channels have a same width and a same length) and, thus, include a same transconductance (gm2). The first switch 202 and the second switch 204 are fabricated from identical and/or approximately identical switch pieces as the fifth switch 214 and the sixth switch 216 and are biased to have a same current density. In this manner, the threshold voltages, the transconductances (gm1, gm2), etc., of the first switch 202, the second switch 204, the fifth switch 214, and the sixth switch 216 are approximately the same. The first switch 202, the second switch 204, the fifth switch 214, and the sixth switch 216 change in a same way (e.g., the threshold voltages, the transconductances, etc., change) over temperature, supply voltage, etc.

In some examples, to set a desired ratio of the first transconductance (gm1) to the second transconductance (gm2), the ratio of the number of transistors in the input differential pair 206 and the feedback differential pair 218 is adjustable while also adjusting the bias current (e.g., the first current biasing source 224 and the third current biasing source 236) to maintain suitable current density. For example, the first switch 202 and the second switch 204 are both formed by 10 transistors coupled in parallel, where each of the 10 transistors has a channel width of size 1 and a channel length of size 7 (e.g., W=1 and L=7). In this example, the first current biasing source 224 provides a current that is ten times the desired current density. Also, in this example, the fifth switch 214 and the sixth switch are both formed by 5 transistors coupled in parallel, where each of the 5 transistors has a channel width of size 1 and a channel length of size 7. In this example, the third current biasing source 236 provides a current that is 5 times the desired current density. Therefore, the ratio of the first transconductance (gm1) to the second transconductance (gm2) is constant and known.

If the resistance value (R) times the second transconductance (gm2) exceeds a threshold, then the Equation 2 above can be even further simplified. For example, the gain of the amplifier 106 can be determined by Equation 3 below, when the resistance value (R) times the second transconductance (gm2) exceeds the threshold (e.g., R*gm2>threshold). In some examples, the threshold is large enough to dominate the denominator of Equation 2. Additionally and/or alternatively, the threshold is indicative of a large transconductance value and/or a large resistance value.

$$\text{Gain}=Vout/Vin=(R\times gm1)/(R\times gm2)=gm1/gm2 \quad \text{Equation 3}$$

In Equation 3 above, the gain can be simplified to the ratio between the two transconductances (gm1 and gm2), because the resistance of the first resistor (R1) 220 and the resistance of the second resistor (R2) 222 are equal and, thus, cancel each other.

The gain of the amplifier 106 is constant in terms of varying temperature, process, supply voltage, etc., because the gain is simply the ratio between the first transconductance (gm1) and the second transconductance (gm2). In some examples, if the transconductances (gm1, gm2) vary, then the gain will not vary because of the ratio. In some examples, the transconductances (gm1, gm2) will vary due to changes in temperature, process variance, aging, and/or bias currents. However, because the input differential pair 206 and the feedback differential pair 218 are fabricated from identical and/or approximately identical switch pieces (e.g., channel sizes, etc.) and are biased to a same current density, the transconductances of the input differential pair 206 and of the feedback differential pair 218 will vary proportionally, thereby ensuring the ratio is constant.

Generally, the amplifier 106 is a high input impedance, low output impedance, and constant gain amplifier. In some examples, the input impedance may be very high, so the reference signal at reference node 120 and the feedback signal at feedback node 118 are usually medium or high impedance, and the amplifier 106 receiving these signals is not configured to load them, and the output voltage of the buck converter 100 will not be incorrectly regulated. In some examples, the input differential pair 206 causes the amplifier 106 to have high input impedance, because the first switch 202 and the second switch 204 are configured as PFETs. In some examples, the matching switches (e.g., matching in size and current density) in the input differential pair 206 and the feedback differential pair 218 cause the amplifier 106 to have a constant gain. In some examples, the feedback differential pair 218 causes the amplifier 106 to have low output impedance due to a negative feedback theorem. In some examples, the negative feedback theorem indicates that the output impedance of an amplifier (e.g., the amplifier 106) in a negative feedback configuration is reduced by an amount of feedback. For example, if the amplifier 106 did not include the feedback differential pair 218, then the gain of the amplifier 106 is referred to as the open loop gain and can be determined using Equation 4 below.

$$A_{openloop} = Vout/Vin = R \times gm1 \qquad \text{Equation 4}$$

In some examples, by adding the feedback differential pair 218 to the amplifier 106, the amplifier 106 receives and/or includes a feedback factor ($\beta$). The feedback factor ($\beta$) is useful to determine the amount of feedback of the amplifier 106 in connection with the open loop gain ($A_{openloop}$) and, thus, is useful to determine how much impedance of the amplifier 106 will be reduced. For example, the amount of feedback ($A_{fb}$) can be determined using Equation 5 below.

$$A_{fb} = 1 + A_{openloop} \times \beta; \beta = gm2/gm1 \qquad \text{Equation 5}$$

In an example scenario, the resistance (R) is 200 kohms (kilohms), and the second transconductance (gm2) is 40 uS (micro Siemens). The amount of feedback can be simplified to one plus the resistance (R) times the second transconductance (gm2), so the amount of feedback ($A_{fb}$) for the above-described example scenario is nine (9). In this example, the output impedance of the amplifier 106 is 9 times lower than the impedance would be without using negative feedback.

Figure 3:
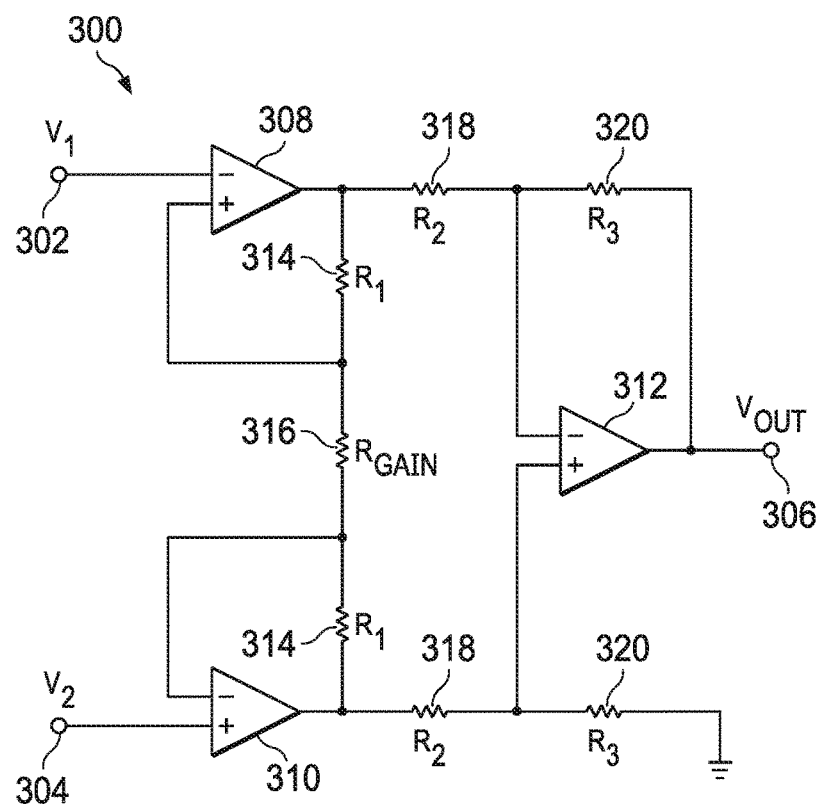
FIG. 3 is a schematic diagram of an example instrumentation amplifier.

FIG. 3 is a schematic diagram of an example instrumentation amplifier 300. The instrumentation amplifier 300 operates similarly to the amplifier 106 of FIGS. 1 and 2 by receiving a feedback signal and a reference signal at a first input 302 and a second input 304 respectively, and providing an error signal at an output 306. The instrumentation amplifier 300 includes an example first operational amplifier (op amp) 308, an example second operation amplifier (op amp) 310, an example third operational amplifier (op amp) 312, example first resistors (R1) 314, an example gain resistor (Rgain) 316, example second resistors (R2) 318, and example third resistors (R3) 320.

In FIG. 3, the first op amp 308 and the second op amp 310 are non-inverting buffer amplifiers, and the third op amp 312 is a difference amplifier. These three op amps (308, 310, 312) form the instrumentation amplifier 300. The output 306 of the instrumentation amplifier 300 is an amplified difference of the input signals applied to each of the respective non-inverting input terminals of the first op amp 308 and the second op amp 310. For example, the output voltage (Vout) at the output 306 is determined using Equation 6 shown below. In Equation 6 below, "R3" is the resistance (in ohms) of the third resistors 320, "R2" is the resistance (in ohms) of the second resistors 318, "Vo1" is the voltage potential at the output of the first op amp 308, and "Vo2" is the voltage potential at the output of the second op amp 310.

$$Vout = (R2/R3) \times (Vo1 - Vo2) \qquad \text{Equation 6}$$

The output voltage (Vout) at the output 306 of the instrumentation amplifier 300 of FIG. 3 can be derived based on the description below. The voltage potential at the inverting input of the first op amp 308 is equal to the voltage potential at the non-inverting input of the first op amp 308, because the first op amp 308 is a buffer, and the inverting input is shorted to the output of the first op amp 308 via one of the first resistors 314. Similarly, the voltage potential at the inverting input of the second op amp 310 is equal to the voltage potential at the non-inverting input of the second op amp 310, because the second op amp 310 is a buffer, and the inverting input is shorted to the output of the second op amp 310 via one of the first resistors 314.

In the instrumentation amplifier 300, the current to the input stage (e.g., the current at the non-inverting inputs of the first op amp 308 and the second op amp 310) is zero, due to the high impedance of the first op amp 308 and the second op amp 310. In some examples, because the input current to the instrumentation amplifier 300 is zero, current through the first resistors (R1) 314 is equal to current through the gain resistor (Rgain) 316. For example, by applying Ohm's law, the current through the first resistors (R1) 314 and the gain resistor (Rgain) 316 can be determined by Equation 7 below. In Equation 7, "$I_1$" is the current in amperes through the first resistors (R1) 314 and the gain resistor (Rgain) 316, "R1" is the resistance in ohms of the first resistors 314, and "Rgain" is the resistance in ohms of the gain resistor 316.

$$I_1 = (Vo1 - Vo2)/((2 \times R1) + Rgain) \qquad \text{Equation 7}$$

In some examples, because the input current is zero, and current through the first resistors (R1) 314 is equal to current through the gain resistor (Rgain) 316, then current through the gain resistor (Rgain) 316 is equal to the current ($I_1$) determined by Equation 7 above. For example, the current through the gain resistor (Rgain) 316 can be determined using Equation 8 below. In Equation 8, "$I_2$" is the current through the gain resistor 316, "V1" is the voltage at the non-inverting input of the first op amp 308, and "V2" is the voltage at the non-inverting input of the second op amp 310.

$$I_2 = (V1 - V2)/Rgain \qquad \text{Equation 8}$$

In some examples, the currents $I_1$ and $I_2$ can be equated (e.g., set equal to each other), in order to determine a difference between: the first voltage (Vo1) at the output of the first op amp 308; and the second voltage (Vo2) at the output of the second op amp 310. For example, the difference between the two voltages at the output of the first op amp 308 and the second op amp 310 can be determined by Equation 9 below.

$$(Vo1 - Vo2) = (2 \times R1 + Rgain) \times (V1 - V2)/Rgain \qquad \text{Equation 9}$$

In some examples, the gain of the instrumentation amplifier 300 can be derived from Equations 6 and 9 above. For example, by rearranging Equation 6 to include Equation 9 (e.g., by substituting Vo1−Vo2 in Equation 6 with Equation 9), the gain can be determined by Equation 10 below. In Equation 10, "Vin" is the difference in voltage between: the input voltage at the non-inverting input of the first op amp 308; and the input voltage at the non-inverting input of the second op amp 310.

$$Vout/Vin = (R3/R2) \times [(2 \times R1 + Rgain)/Rgain] \qquad \text{Equation 10}$$

The overall gain of the instrumentation amplifier 300 is controllable by adjusting a resistance of the gain resistor (Rgain) 316. In some examples, if the gain resistor 316 degrades over temperature, process and/or supply voltage, the gain of the instrumentation amplifier 300 may also degrade. This is just one example of how the amplifier 106 of FIGS. 1 and 2 is improved over the instrumentation amplifier.

In a second example, complexity of the instrumentation amplifier 300 of FIG. 3 is greater than complexity of the amplifier 106 of FIGS. 1 and 2. For example, the instrumentation amplifier 300 (e.g., 308, 310, 312) includes three operational amplifiers for proper operation. Also, the instrumentation amplifier 300 of FIG. 3 includes multiple resistors to set the gain of the instrumentation amplifier 300. However, the amplifier 106 of FIGS. 1 and 2 do not include three operational amplifiers, and they do not require a number of resistors to set the gain.

Example methods, apparatus and articles of manufacture described herein improve the operations and complexity of an amplifier. The described methods, apparatus and articles of manufacture improve the operations and complexity of the amplifier by implementing two differential pairs, where both differential pairs include transistors having identical and/or approximately identical sizes (such as their channel sizes, etc.), current densities, and, thus, transconductances. The amplifier described herein has high input impedance based on the input differential pair, low output impedance based on the negative feedback of the feedback differential pair, and a constant gain based on the transconductances of the two differential pairs. The described amplifier has a less complex configuration and has a very fast start up from a low power state. Also, the described amplifier applies negative feedback, which reduces the output impedance significantly. Otherwise, 5-10× more area and bias current would be consumed to achieve a same output impedance level without using negative feedback (i.e., in an open loop configuration using simply transistors as buffers).

Example methods, apparatus, systems, and articles of manufacture to improve an instrumentation amplifier are described herein such as the following.

Example 1 includes a system comprising a feedback network (102) having a feedback output terminal, a digital to analog converter (DAC) (104) having an analog output terminal, and an amplifier (106) including an input differential pair (206) having an inverting input terminal, a non-inverting input terminal, a first output current terminal, and a second output current terminal, the inverting input terminal coupled to the feedback output terminal, and the non-inverting input terminal coupled to the first output terminal, a feedback differential pair (218) having a third output current terminal, a fourth output current terminal, a first input terminal, and a second input terminal, the third output current terminal coupled to the first output current terminal, and the fourth output current terminal coupled to the second output current terminal, and an amplifier output terminal coupled to the first input terminal and the second input terminal.

Example 2 includes the system of example 1, further comprising a loop comparator (108) having a first loop input terminal and a second loop input terminal, the first loop input terminal is coupled to the feedback output terminal, and the second loop input terminal is coupled to the output terminal.

Example 3 includes the system of example 2, wherein the loop comparator (108) includes a loop comparator output terminal.

Example 4 includes the system of example 3, further comprising a pulse width modulation (PWM) generator (110) having a PWM input terminal, a PWM output terminal, and a clock input terminal (126), the PWM input terminal coupled to the loop comparator output terminal.

Example 5 includes the system of example 4, further comprising a gate driver (112) having a gate driver input terminal coupled to the PWM output terminal.

Example 6 includes the system of example 1, wherein the amplifier (106) includes a buffer stage (212) including a third input terminal coupled to the first output current terminal and the third output current terminal, a fourth input terminal coupled to the second output current terminal and the fourth output current terminal, a fifth output current terminal coupled to the first input terminal, and a sixth output current terminal coupled to the second input terminal.

Example 7 includes the system of example 1, wherein the amplifier (106) includes a first resistor (220) having a first terminal coupled to the first output current terminal, and a second resistor (222) having a second terminal coupled to the second output current terminal.

Example 8 includes an amplifier (106) comprising a first differential pair (206) including a first switch (202) having a first gate, a first current terminal, and a second current terminal, and a second switch (204) having a second gate, a third current terminal, and a fourth current terminal, the fourth current terminal coupled to the second current terminal, a buffer stage (212) including a third switch (208) and a fourth switch (210), and a second differential pair (218) including a fifth switch (214) having a third gate and a fifth current terminal, the fifth current terminal coupled to the first current terminal, and a sixth switch (216) having a fourth gate and a sixth current terminal, the fourth gate coupled to the fourth switch (210), and the sixth current terminal coupled to the third current terminal.

Example 9 includes the amplifier of example 8, wherein the first switch (202), the second switch (204), the third switch (208), the fourth switch (210), the fifth switch (214), and the sixth switch (216) are p-channel field-effect transistors (PFETs).

Example 10 includes the amplifier (106) of example 9, wherein channel sizes of the first switch (202), the second switch (204), the fifth switch (214) and the sixth switch (216) are approximately equal.

Example 11 includes the amplifier of example 9, wherein channel sizes of the third switch (208) and the fourth switch (210) are approximately equal.

Example 12 includes the amplifier (106) of example 8, wherein the third switch (208) includes a fifth gate coupled to the first current terminal, and a seventh current terminal coupled to the third gate.

Example 13 includes the amplifier (106) of example 8, wherein the fourth switch (210) includes a sixth gate coupled to the third current terminal, and an eighth current terminal coupled to the fourth gate.

Example 14 includes the amplifier (106) of example 8, further comprising a first resistor (220) having a first resistor terminal and a second resistor terminal, the second resistor terminal coupled to a ground terminal, and a second resistor (222) having a third resistor terminal and a fourth resistor terminal, the fourth resistor terminal coupled to the ground terminal.

Example 15 includes the amplifier (106) of example 14, wherein the first resistor terminal is coupled to the first current terminal, the fifth current terminal, and a gate of the third switch (208).

Example 16 includes the amplifier (106) of example 14, wherein the third resistor terminal is coupled to the third current terminal, the sixth current terminal, and a gate of the fourth switch (210).

Example 17 includes the amplifier (106) of example 8, further comprising a first current biasing source (224) having a first output terminal coupled to the second current terminal and the fourth current terminal, a second current biasing source (236) having a second output terminal coupled to a seventh current terminal of the fifth switch (214) and an eighth current terminal of the sixth switch (216), and a third current biasing source (230) having a third output terminal and a fourth output terminal, the third output terminal coupled to a ninth current terminal of the third switch (208), and the fourth output terminal coupled to a tenth current terminal of the fourth switch (210).

Example 18 includes a method comprising generating a first voltage (V1) responsive to a first input signal (118) at a gate of a first transistor (202), generating a second voltage (V2) responsive to a second input signal (120) at a gate of a second transistor (204), shifting the first voltage (V1) to a first output voltage (Vout_p) responsive to the first voltage (V1) input to a gate of a third transistor (208), shifting the second voltage (V2) to a second output voltage (Vout_n) responsive to the second voltage (V2) input to a gate of a fourth transistor (210), reducing a first impedance of the first output voltage (Vout_p) responsive to feeding back the first output voltage (Vout_p) to a gate of a fifth transistor (214), and reducing a second impedance of the second output voltage (Vout_n) responsive to feeding back the second output voltage (Vout_n) to a gate of a sixth transistor (216).

Example 19 includes the method of example 18, further including providing a first current ($I_3$) at a current terminal of the first transistor (202) to a first resistor (220) responsive to the first input signal (118) at the gate of the first transistor (202), outputting a second current ($I_4$) at a current terminal of the second transistor (204) to a second resistor (222) responsive to the second input signal (120) at the gate of the second transistor (204), outputting a third current ($I_5$) at a current terminal of the fifth transistor (214) to the first resistor (220) responsive to the first output voltage (Vout_p) fed back to the gate of the fifth transistor (214), outputting a fourth current ($I_6$) at a current terminal of the sixth transistor (216) to the second resistor (222) responsive to the second output voltage (Vout_n) fed back to the gate of the sixth transistor (216), generating the first voltage (V1) using a resistance of the first resistor (220), the first current ($I_3$), and the third current ($I_5$), and generating the second voltage (V2) using a resistance of the second resistor (222), the second current ($I_4$), and the fourth current ($I_6$).

Example 20 includes the method of example 18, further comprising generating a first bias current configured to bias the first transistor (202) and the second transistor (204) with matching current densities, and generating a second bias current configured to bias the fifth transistor (214) and the sixth transistor (216) with matching current densities.

Example 21 includes the method of example 20, further comprising determining a gain of an amplifier including the first transistor (202), the second transistor (204), the third transistor (208), the fourth transistor (210), the fifth transistor (214) and the sixth transistor (216) based on: a) the matching current densities of the first transistor (202) and the second transistor (204), b) the matching current densities of the fifth transistor (214) and the sixth transistor (216), and c) matching channel widths and lengths of the first transistor (202), the second transistor (204), the fifth transistor (214) and the sixth transistor (216).

In this description, the term "and/or" (when used in a form such as A, B and/or C) refers to any combination or subset of A, B, C, such as: (a) A alone; (b) B alone; (c) C alone; (d) A with B; (e) A with C; (f) B with C; or (g) A with B and with C. Also, as used herein, the phrase "at least one of A or B" (or "at least one of A and B") refers to implementations including any of: (a) at least one A; (b) at least one B; or (c) at least one A and at least one B.

In this description, unless otherwise stated, if two components or values are described as being "approximately" the same, "approximately" equal or "approximately" identical, then it means they are within +/−5 percent (±5%) of each other.

Modifications are possible in the described embodiments, and other embodiments are possible, within the scope of the claims.

What is claimed is:

1. A system comprising:
a feedback network having a feedback output terminal;
a digital to analog converter (DAC) having an analog output terminal; and
an amplifier including:
an input differential pair having an inverting input terminal, a non-inverting input terminal, a first output current terminal and a second output current terminal, the inverting input terminal coupled to the feedback output terminal, and the non-inverting input terminal coupled to the analog output terminal;
a feedback differential pair having a third output current terminal, a fourth output current terminal, a first input terminal and a second input terminal, the third output current terminal coupled to the first output current terminal, and the fourth output current terminal coupled to the second output current terminal; and
an amplifier output terminal coupled to the first input terminal and the second input terminal.

2. The system of claim 1, further comprising a loop comparator having a first loop input terminal and a second loop input terminal, the first loop input terminal is coupled to the feedback output terminal, and the second loop input terminal is coupled to the amplifier output terminal.

3. The system of claim 2, wherein the loop comparator includes a loop comparator output terminal.

4. The system of claim 3, further comprising a pulse width modulation (PWM) generator having a PWM input terminal, a PWM output terminal and a clock input terminal, the PWM input terminal coupled to the loop comparator output terminal.

5. The system of claim 4, further comprising a gate driver having a gate driver input terminal coupled to the PWM output terminal.

6. The system of claim 1, wherein the amplifier includes a buffer stage including:
a third input terminal coupled to the first output current terminal and the third output current terminal;
a fourth input terminal coupled to the second output current terminal and the fourth output current terminal;
a fifth output current terminal coupled to the first input terminal; and
a sixth output current terminal coupled to the second input terminal.

7. The system of claim 1, wherein the amplifier includes:
a first resistor having a first terminal coupled to the first output current terminal; and
a second resistor having a second terminal coupled to the second output current terminal.

8. An amplifier comprising:
a first differential pair including:
a first switch having a first gate, a first current terminal and a second current terminal; and
a second switch having a second gate, a third current terminal and a fourth current terminal, the fourth current terminal coupled to the second current terminal;
a buffer stage including a third switch and a fourth switch; and a second differential pair including:
- a fifth switch having a third gate and a fifth current terminal, the fifth current terminal coupled to the first current terminal; and
- a sixth switch having a fourth gate and a sixth current terminal, the fourth gate coupled to the fourth switch, and the sixth current terminal coupled to the third current terminal.

9. The amplifier of claim 8, wherein the first switch, the second switch, the third switch, the fourth switch, the fifth switch and the sixth switch are p-channel field-effect transistors (PFETs).

10. The amplifier of claim 9, wherein channel sizes of the first switch, the second switch, the fifth switch and the sixth switch are approximately equal.

11. The amplifier of claim 9, wherein channel sizes of the third switch and the fourth switch are approximately equal.

12. The amplifier of claim 8, wherein the third switch includes: a fifth gate coupled to the first current terminal; and a seventh current terminal coupled to the third gate.

13. The amplifier of claim 8, wherein the fourth switch includes: a sixth gate coupled to the third current terminal; and an eighth current terminal coupled to the fourth gate.

14. The amplifier of claim 8, further comprising:
- a first resistor having a first resistor terminal and a second resistor terminal, the second resistor terminal coupled to a ground terminal; and
- a second resistor having a third resistor terminal and a fourth resistor terminal, the fourth resistor terminal coupled to the ground terminal.

15. The amplifier of claim 14, wherein the first resistor terminal is coupled to the first current terminal, the fifth current terminal, and a gate of the third switch.

16. The amplifier of claim 14, wherein the third resistor terminal is coupled to the third current terminal, the sixth current terminal, and a gate of the fourth switch.

17. The amplifier of claim 8, further comprising:
- a first current biasing source having a first output terminal coupled to the second current terminal and the fourth current terminal;
- a second current biasing source having a second output terminal coupled to a seventh current terminal of the fifth switch and an eighth current terminal of the sixth switch; and
- a third current biasing source having a third output terminal and a fourth output terminal, the third output terminal coupled to a ninth current terminal of the third switch, and the fourth output terminal coupled to a tenth current terminal of the fourth switch.

18. A method comprising:
generating a first voltage responsive to a first input signal at a gate of a first transistor;
generating a second voltage responsive to a second input signal at a gate of a second transistor;
shifting the first voltage to a first output voltage responsive to the first voltage input to a gate of a third transistor;
shifting the second voltage to a second output voltage responsive to the second voltage input to a gate of a fourth transistor;
reducing a first impedance of the first output voltage responsive to feeding back the first output voltage to a gate of a fifth transistor; and
reducing a second impedance of the second output voltage responsive to feeding back the second output voltage to a gate of a sixth transistor.

19. The method of claim 18, further comprising:
providing a first current at a current terminal of the first transistor to a first resistor responsive to the first input signal at the gate of the first transistor;
outputting a second current at a current terminal of the second transistor to a second resistor responsive to the second input signal at the gate of the second transistor;
outputting a third current at a current terminal of the fifth transistor to the first resistor responsive to the first output voltage fed back to the gate of the fifth transistor;
outputting a fourth current at a current terminal of the sixth transistor to the second resistor responsive to the second output voltage fed back to the gate of the sixth transistor;
generating the first voltage using a resistance of the first resistor, the first current and the third current; and
generating the second voltage using a resistance of the second resistor, the second current and the fourth current.

20. The method of claim 18, further comprising:
generating a first bias current configured to bias the first transistor and the second transistor with matching current densities; and
generating a second bias current configured to bias the fifth transistor and the sixth transistor with matching current densities.

21. The method of claim 20, further comprising determining a gain of an amplifier including the first transistor, the second transistor, the third transistor, the fourth transistor, the fifth transistor and the sixth transistor based on: (a) the matching current densities of the first transistor and the second transistor; (b) the matching current densities of the fifth transistor and the sixth transistor; and (c) matching channel widths and lengths of the first transistor, the second transistor, the fifth transistor and the sixth transistor.

* * * * *